United States Patent [19]
George et al.

[11] Patent Number: 5,981,110
[45] Date of Patent: Nov. 9, 1999

[54] METHOD FOR REPAIRING PHOTOMASKS

[75] Inventors: Merrilou George, Jericho; Timothy E. Neary, Essex Junction, both of Vt.

[73] Assignee: International Business Machines Corporation, Armonk, N.Y.

[21] Appl. No.: 09/024,070

[22] Filed: Feb. 17, 1998

[51] Int. Cl.⁶ .................................................... G03F 9/00
[52] U.S. Cl. ............................................................ 430/5
[58] Field of Search ............................... 430/5, 322, 324; 378/34, 35

[56] References Cited

U.S. PATENT DOCUMENTS

| | | |
|---|---|---|
| 3,748,975 | 7/1973 | Tarabocchia . |
| 4,200,668 | 4/1980 | Segal et al. . |
| 4,548,883 | 10/1985 | Wagner . |
| 4,592,975 | 6/1986 | Young et al. . |
| 4,636,403 | 1/1987 | Fisanick et al. . |
| 4,704,304 | 11/1987 | Amendola et al. . |
| 4,727,234 | 2/1988 | Oprysko et al. . |
| 4,820,898 | 4/1989 | Slingerland . |
| 4,906,326 | 3/1990 | Amemiya et al. . |
| 5,035,787 | 7/1991 | Parker et al. . |
| 5,164,565 | 11/1992 | Addiego et al. . |
| 5,165,954 | 11/1992 | Parker et al. . |
| 5,272,116 | 12/1993 | Hosono ................................ 430/5 |

OTHER PUBLICATIONS

Peiyang Yan et al., "Effect of Laser Mask Repair Induced Residue and Quartz Damage in Sub–half–micron DUV Wafer Process," Proceedings of 15th Annual Symposium on Photomask Technology and Management, (Sep. 20–22, 1995) SPIE vol. 2621) pp. 158–166.

J. M. E. Harper et al., "Method for Improving Resolution of Focused Ion Beam Mask Repair Process," IBM TDB, n10a, (Mar. 1991) pp. 174–176.

P. G. Blauner, IBM Technical Disclosure Bulletin, v. 39, n1, (Jan. 1996) pp. 287–290.

*Primary Examiner*—S. Rosasco
*Attorney, Agent, or Firm*—Ratner & Prestia; Howard J. Walter, Jr.

[57] ABSTRACT

A method for repairing a defect in an opaque layer of a photomask by applying a photoresist layer over the opaque layer and then removing the photoresist over the defect to reveal the defect which is repaired by a wet etch. The repair procedure of the present invention is "self-aligning" in that the portion of the photoresist layer covering the defect, prior to being removed, extends to the edges of the defect, so that only this portion of the photoresist layer is removed to reveal only the defect in the opaque layer.

21 Claims, 3 Drawing Sheets

METHOD FOR REPAIRING PHOTOMASKS

FIELD OF THE INVENTION

The present invention relates, in general, to a method for selective removal of portions of a metallic layer or an attenuated material on a transparent substrate and, in particular, to a method for removing opaque defects in photomasks.

BACKGROUND OF THE INVENTION

Photomasks are used extensively in the fabrication of integrated circuits on semiconductor wafers. Standard photomasks include a patterned light reflecting opaque layer or film on a transparent substrate. A metal, such as chromium, having a thickness on the order of about 1000 Å is often used as the opaque layer or film. Nickel and aluminum also are used. Quartz is often used as the transparent substrate, though materials such as glass and sapphire can also be used.

Phase shift photomasks may include, in addition to patterned chromium on quartz, means to change the phase of light near the chromium edge, such as an etched region in the quartz or a transparent layer on the quartz near a chromium edge. Phase shift photomasks can also include, instead of a totally opaque material, an absorbing material (i.e., an attenuator) that permits transmission of a small fraction of the light.

The fabrication of photomasks usually involves a blanket deposition of a thin layer or film of chromium on the quartz substrate. The chromium is then coated with photoresist, which is exposed with a high resolution technique, such as an electron beam, and developed to form the desired pattern in the resist. This pattern is then transferred into the chromium by etching, thereby leaving opaque and transparent regions on the mask.

The photomask manufacturing process often results in imperfections, so that defects frequently are encountered during inspection of the photomasks. Defects are categorized as either "clear defects," or "opaque defects." Clear defects are regions that are designed to have the chromium but which actually do not have chromium. FIGS. 1a through 1f illustrate six of the most common defects seen on photolithography masks. FIG. 1a shows a mask 20 having an opaque bridge 21 between chromium lines 22a and 22b on a quartz substrate 24. FIG. 1b shows an opaque extension 26 extending from a chromium line 22a into a transparent region 27 between chromium lines 22a and 22b on a quartz substrate 24. FIG 1c shows an isolated opaque spot 28 in transparent region 27 between chromium lines 22a and 22b on a quartz substrate 24. FIG. 1d shows a pinhole 30 in a chromium line 22a on a quartz substrate 24. FIG. 1e shows a clear extension 32 into a chromium line 22a on a quartz substrate 24. FIG. 1f shows a clear bridge 34 extending across a chromium line 22a on a quartz substrate 24.

Masks having sufficiently large structures can be repaired using a technique described in U.S. Pat. No. 3,748,975, to Tarabocchia, in which photoresist is applied to the mask and exposed in a rectangular region including the defect to either open up a window for etching opaque defects away or to leave a region of tinted negative photoresist to fill in a clear defect. However, for opaque and clear defects that are attached to metal lines, normal process variations in the exposure, develop, and etch steps are too great to remove just the required amount of defect and provide a line having the desired shape within the tolerance required of present and future masks. For example, masks are currently being generated with lines having a width of 0.3 mm that typically have a tolerance in that width of about ten percent or, more preferably, about five percent. This precision is not achievable with standard photolithographic techniques and the repair is likely either to leave unwanted material on the mask or to remove wanted material from the adjacent opaque region. Thus, present masks have been repaired using highly focused beams of photons or ions.

More specifically, opaque defect repair currently involves laser evaporation or ablation or focused ion beam (FIB) sputtering of the unwanted chromium in defect regions such as opaque bridge 21 of FIG. 1a, opaque extension 26 of FIG. 1b, and opaque spot 28 of FIG. 1c. However, as with photolithographic processes, because the resolution of a laser is limited, if the opaque defect is connected to an adjacent chromium line as in FIGS. 1a and 1b, laser ablation may damage that adjacent line, removing some wanted chromium from the line. In addition, because a great deal of thermal energy is transmitted with the laser beam, the laser ablation step not only melts and vaporizes the unwanted metal defect region, but also damages and removes a layer of quartz underlying and adjacent the opaque defect, producing roughness in the quartz, as described in a paper "Effect of Laser Mask Repair Induced Residue and Quartz Damage in Sub-half-micron DUV Wafer Process," by Peiyang Yan et al., *Proceedings of the 15th Annual Symposium on Photomask Technology and Management*, Sep. 20–22, 1995, SPIE Volume 2621, pp. 158–166. This damaged region of the quartz is also responsible for reduced transmission and altered phase of transmitted light.

As an alternative to laser ablation, FIB offers a controlled process for sputtering a small region of unwanted material. The ion beam can be focused to a much smaller size than the laser beam. In addition, the ion beam physically sputters material, transmitting very little thermal energy to the mask. Thus, the quartz is not pitted. However, there are a number of problems that limit the use of FIB for mask repair. First, because a mask is formed on a quartz substrate which is an insulating material, the ion beam rapidly charges the surface and both the ability to aim subsequent ions and to use the ion beam to image the results is degraded. Second, while an opaque defect is being removed, quartz at the edge of the defect is attacked at the same rate and the result is a "river bed" or trench of damaged quartz around the defect, the quartz in this region having altered transmission and phase. Third, the focused ion beam species is typically gallium and gallium has been found implanted into the quartz when the opaque defect is removed, causing transmission losses. Fourth, the sputtering of material by the ion beam leads to ejection of material in all directions and some of this ejected material comes to rest on adjacent edges as described in an article by J. M. E. Harper et al., "Method for Improving Resolution of Focused Ion Beam Mask Repair Process," *IBM TDB*, n10a, March, 1991, pp. 174–176.

Clear defects can be repaired using a beam stimulated deposition process such as laser deposition or FIB induced deposition. These processes typically involve the decomposition of volatile organometallic complexes for which decomposition can be induced by the beam. Mask repair systems for laser deposition and FIB deposition have been commercially available for many years and the processes are well known in the art. However, a thin halo of deposited material is found adjacent the laser repaired region. The halo is the result of deposition along the periphery of the laser spot where there is a low, but non-negligible, light intensity. Thus, the edges of laser deposited material are difficult to control and trimming is usually required. This trimming step introduces the same kinds of problems and defects which occur when removing other opaque defects.

Similarly, while FIB deposition to repair clear defects is more controllable than laser deposition, because the ion beam current profile also has a long tail which extends well beyond the nominal beam diameter, material is deposited in a relatively large area surrounding the intended deposit, as described in an article "Elimination of Excess Material During Focused Ion Beam Induced Deposition", by P. G. Blauner, *IBM Technical Disclosure Bulletin*, v 39, n1, January, 1996, pp. 287–290. This peripheral film is a fraction of the thickness of the intended deposit but often must be removed to avoid degradation of transmission in surrounding clear regions. Removal of the peripheral film, or "halo", requires an extra step which adds to the complexity and time required for the repair process and introduces another possibility for damaging the quartz or otherwise introducing defects. In addition, because the quartz substrate charges during ion beam processing, the ion beam can be deflected and the repair patch, therefore, will not be located where expected.

One proposed clear defect repair technique, described in U.S. Pat. No. 4,200,668 to Segal et al., provides for repairing pinholes in the metal of a photomask by depositing resist on the mask, opening a window exclusively in the region of the pinhole by burning through the resist in that region with a laser, etching in the window to remove additional metal, thereby widening the pinhole and providing a more adhesive surface, depositing an opaque material on the entire surface and then lifting off the opaque material on the resist leaving it in the window adhering to the adjacent metal surrounding the pinhole. While this repair process is suitable for isolated pinhole defects, it is not adequate for clear defects at the edge of a metal line that require accurate reshaping and aligning, such as the clear extension and clear bridge of FIGS. 1e and 1f.

SUMMARY OF THE INVENTION

According to the present invention, a method of repairing an opaque defect in a photomask comprises the steps of providing a photomask having a transparent substrate layer and a patterned light-reflecting opaque layer on the transparent substrate layer by which desired opaque and transparent regions and an undesired opaque defect are formed on the transparent substrate layer. An opaque defect in the patterned light-reflecting opaque layer is detected and then a photoresist layer is deposited on the patterned light-reflecting opaque layer. Next, a selected thickness of the photoresist layer extending from an open surface thereof is hardened and then a metallic layer is deposited on the open surface of the photoresist layer. An opening above the opaque defect in the patterned light-reflecting opaque layer is developed. This opening extends through the metallic layer and into the photoresist layer beyond the hardened thickness of the photoresist layer. A light is applied into the opening to expose the photoresist layer above the opaque defect after which the exposed photoresist is removed to reveal the opaque defect in the patterned light-reflecting opaque layer. The opaque defect then is removed and the remaining metallic layer and the remaining photoresist are removed.

The foregoing and other aspects of the present invention are described in the detailed description of the invention in conjunction with the accompanying drawings.

DETAILED DESCRIPTION OF THE INVENTION

Referring to FIGS. 2a through 2e, 3a and 3b, a method of repairing an opaque defect in a photomask practiced in accordance with the present invention includes providing a photomask having a transparent substrate layer 100, for example quartz, and a patterned light-reflecting opaque layer 110, for example chromium, on the transparent substrate layer. Opaque layer 110 is deposited on substrate layer 100 and patterned and etched in a conventional manner to leave desired opaque and transparent regions on substrate layer 100. Opaque layer 110 typically has a thickness of about 1000 Å.

Figure 1A:
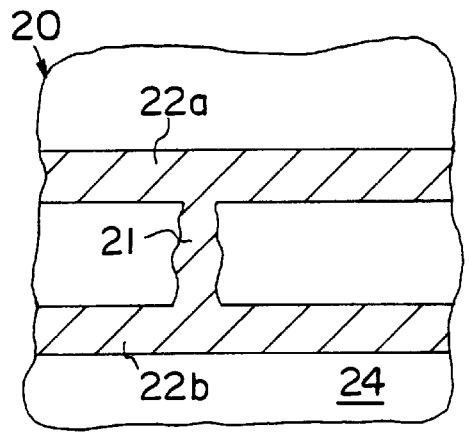
FIGS. 1a through 1f are cross-section views of a photomask showing six types of photomask defects known in the prior art.
Figure 1B:
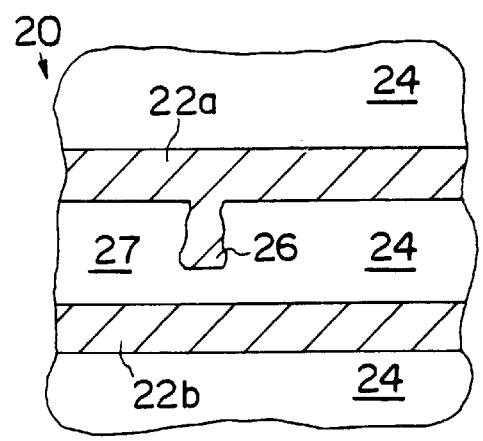
Figure 1C:
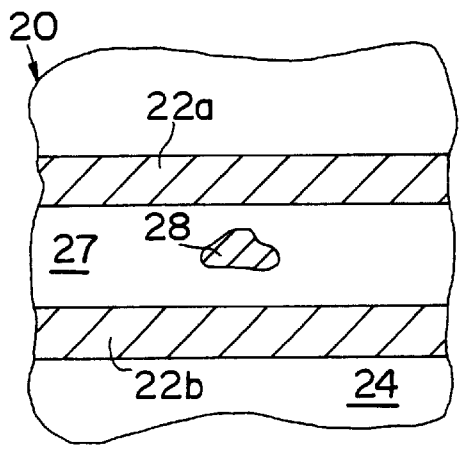
Figure 1D:
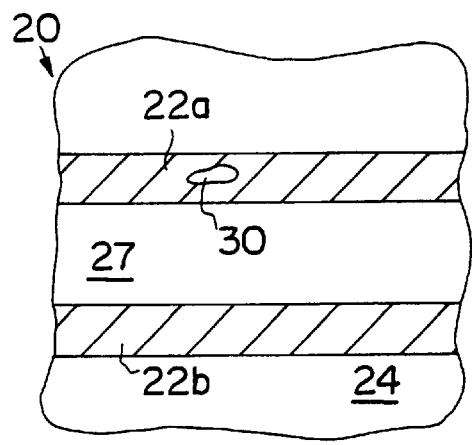
Figure 1E:
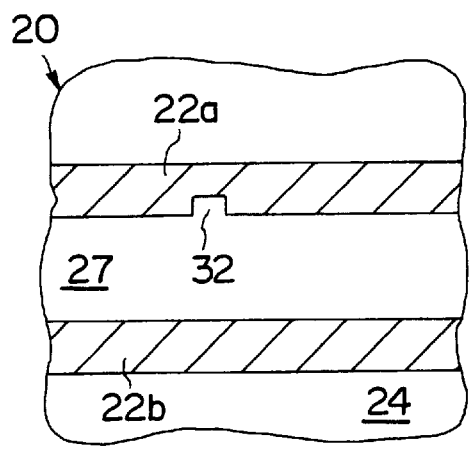
Figure 1F:
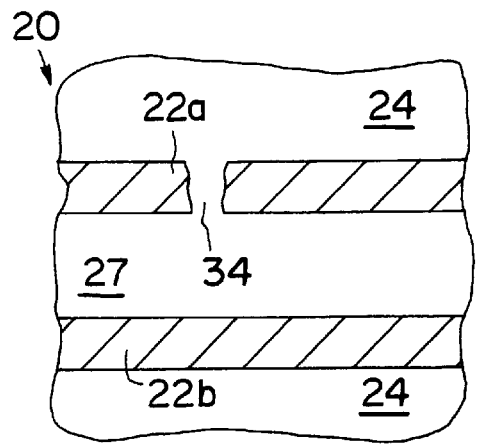
Figure 2A:
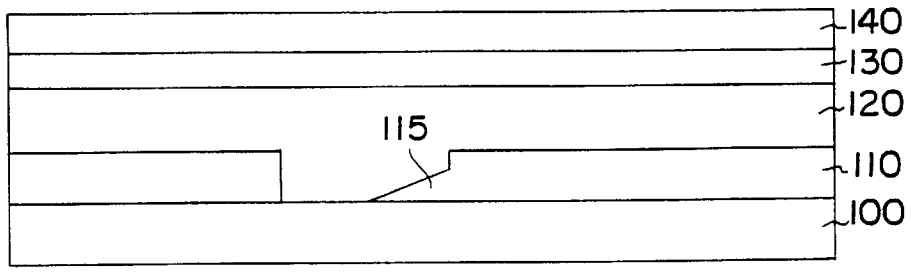
FIGS. 2a through 2e are cross-section views of a photomask showing various stages of repairing defects in a photomask in accordance with the present invention.
Figure 2B:
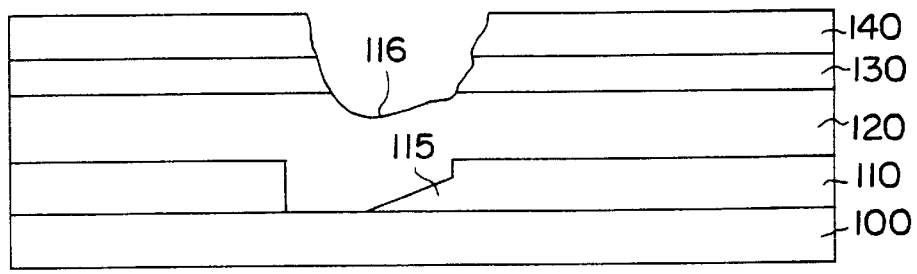
Figure 2C:
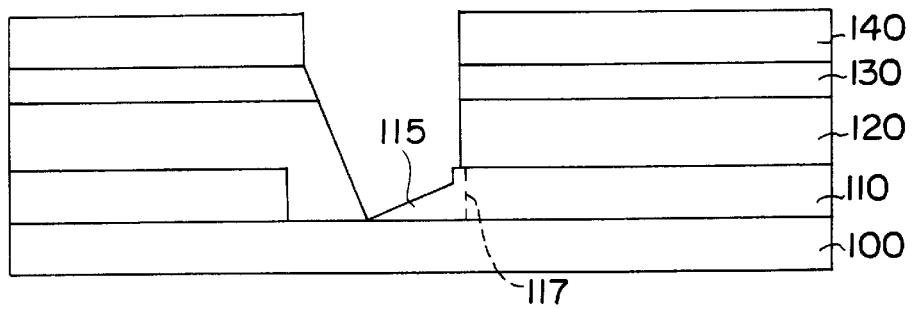

In practice, undesired defects in opaque layer 110 are developed. One such defect, an opaque, tapered defect identified by reference numeral 115, is shown in FIGS. 2a through 2c. Other defects, such as full-thickness defects, can occur. Such opaque defects are detected by conventional means.

After opaque defect 115 is detected, a photoresist layer 120 is deposited on patterned light-reflecting opaque layer 110 in accordance with the present invention. Photoresist layer 120, for example 895i or PBS, is deposited to a preferred thickness of 0.5 microns.

In accordance with the present invention, a selected thickness, for example monolayer to 200 Å, extending from an open top surface of photoresist layer 120 is hardened. This selected thickness, identified by reference numeral 130, is hardened by exposure to ultraviolet light for a time period of thirty minutes, for example.

Next, in accordance with the present invention, a metallic layer 140, for example copper, is deposited on the open surface of photoresist layer 120, preferably by sputtering, to a preferred thickness of 75 Å. Metallic layer 140 serves as a opaque etch stop material when opaque defect 115 is removed as will be explained below.

In accordance with the present invention, an opening 116 is developed above opaque defect 115 which extends through metallic layer 140 and into photoresist layer 120 beyond the hardened thickness 120 of the photoresist layer. Opening 116, shown in FIGS. 3a and 3b by dot-dash lines, can be formed by laser ablation, for example with a DRS laser system.

As light then is applied into opening 116, in accordance with the present invention, photoresist layer 120, including the hardened thickness 130 of the photoresist layer, above opaque defect 115 is exposed and its composition is changed. The DRS laser system can also serve as the source of this light.

Figure 3A:
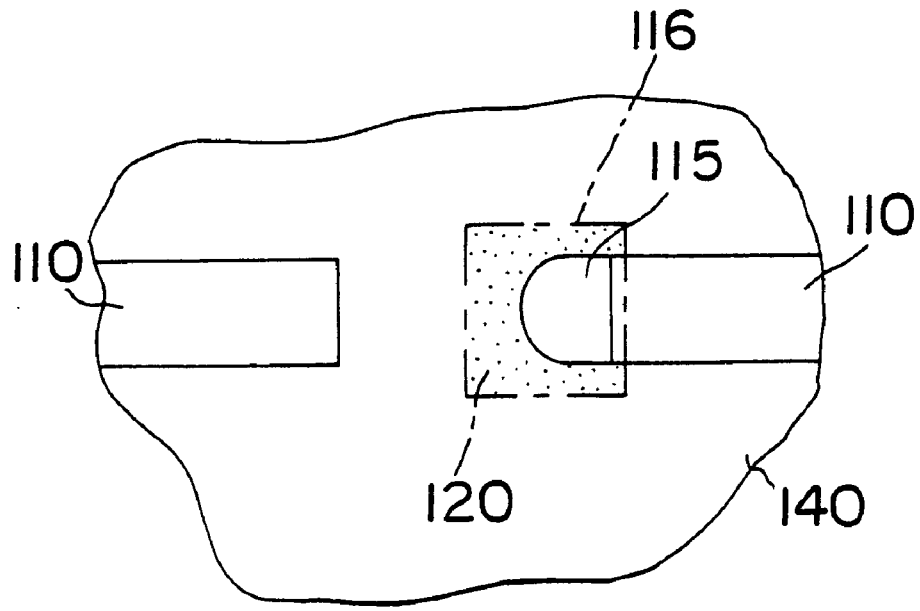
FIGS. 3a and 3b are top views of a photomask at two stages of repairing an opaque defect in a photomask in accordance with the present invention.

Next, in accordance with the present invention, the exposed photoresist layer 120 is removed, for example by conventional photoresist development, to wash away the exposed photoresist and reveal opaque defect 115. In the region of opaque defect 115, photoresist layer 120 is fully exposed when light is applied to opening 116 because the light passes through this portion of the photoresist layer twice; first the original transmission and second the reflection by opaque layer 110 (i.e. opaque defect 115). In contrast, light passing through photoresist layer 120, which is not reflected by opaque layer 110, passes through transparent substrate layer 100. Photoresist layer 120 in this region is not fully exposed and is not washed away during photoresist development but rather remains in place to cover transparent substrate layer 100 when that portion of photoresist layer 120 above opaque defect 115 is removed. This is shown in FIG. 3a by opaque defect 115 which is revealed and clear of photoresist but surrounded by photoresist layer 120. In effect, the repair procedure of the present invention is "self-aligning" in that the portion of the photoresist layer 120 covering opaque defect 115, prior to being washed away, extends to the edges of the opaque defect. Opaque layer 110 reflects sufficient light through photoresist layer 120 to fully expose the photoresist above the region of defect 115, while transparent substrate layer 100 reflects no light or such little light that the photoresist is not fully exposed over those portions of the opaque layer where material is not to be removed from the opaque layer. It is apparent that materials other than quartz for substrate layer 100 and chromium for opaque layer 110 can be used. The important considerations in selecting these materials are the relative reflectivities of the opaque layer and the substrate layer.

Figure 2D:
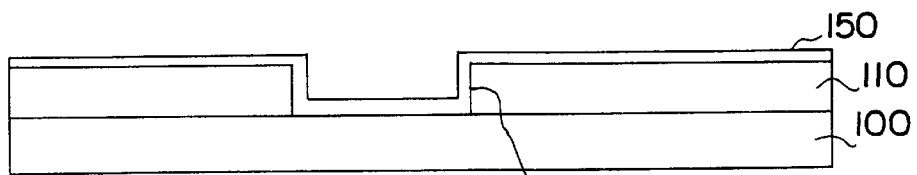
Figure 2E:
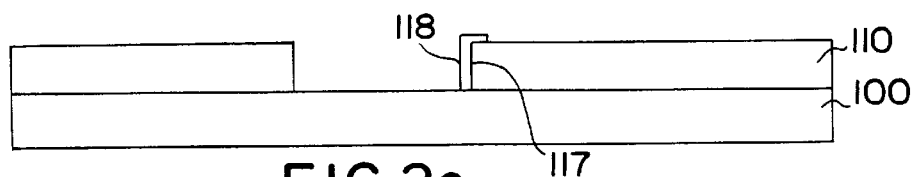
Figure 3B:
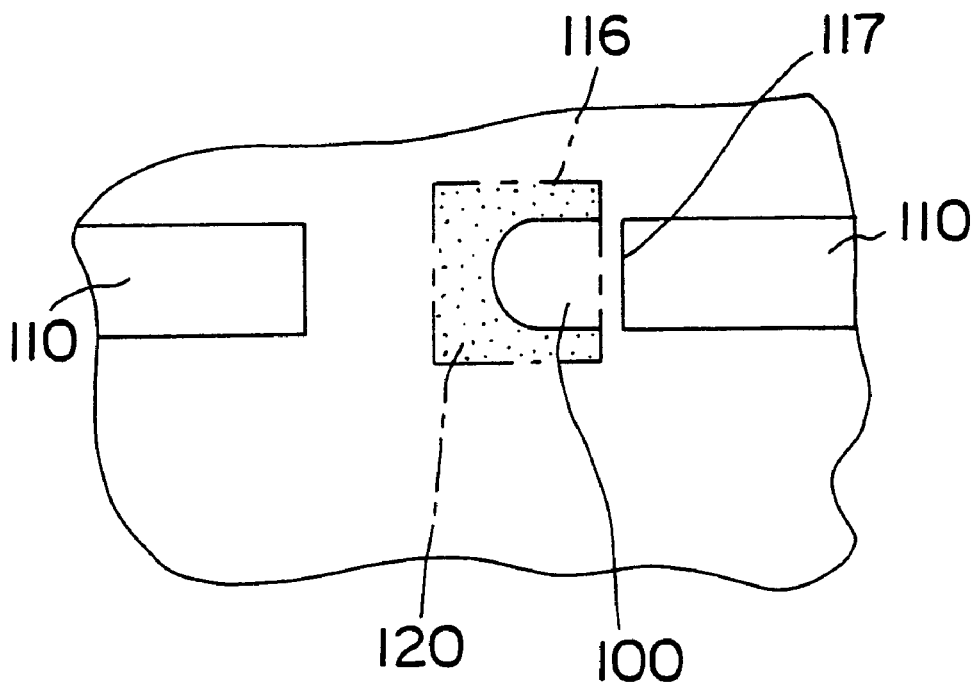

After opaque defect 115 is revealed, the defect is removed, preferably by a wet etch or a dry etch which does not affect transparent substrate layer 100. As indicated above, metallic layer 140 protects against etching of photoresist layer 120, including the hardened thickness 130 of the photoresist layer, by serving as a barrier if the photoresist layer has pinhole (i.e. clear) defects. As shown in FIGS. 2d, 2e and 3b and represented by a dashed line in FIG. 2c, opaque layer 110 is undercut by the wet etch and a small portion of the opaque layer 110 beneath photoresist layer 120 is removed by the wet etch.

Next, in accordance with the present invention, the remaining metallic layer 140 and the remaining photoresist layer 120 and 130 are removed by conventional means, for example by a hot sulfuric peroxide or a ten percent dilute nitric acid.

Preferably, a metallic layer 150, for example semiconductor grade copper, then is deposited to a thickness of between 50 Å and 100 Å over the photomask, including opaque layer 110 and the clear region of substrate layer 100. Using an FIB system, clear defects, created before or during repair of opaque defect 115, are repaired in the conventional manner. Metallic layer 150 is then stripped to yield a defect-free photomask composed of substrate layer 100 and opaque layer 110 as shown in FIG. 2e. Then, depending upon the specifications of the photomask and the amount of undercut into opaque layer 115 during the wet etch step, a metallic piece, preferably gold and identified in FIG. 2e by reference numeral 118, is attached to opaque layer 110 to replace the extra portion of the opaque layer removed by the wet etch when opaque defect 115 was removed.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A method for repairing an opaque defect in a photomask comprising the steps of:
    providing a photomask having:
        (a) a transparent substrate layer, and
        (b) a patterned light-reflecting opaque layer on said transparent substrate layer by which:
            (1) desired opaque and transparent regions, and
            (2) an undesired opaque defect
            are formed on said transparent substrate layer;
    detecting said opaque defect in said patterned light-reflecting opaque layer;
    depositing a photoresist layer on said patterned light-reflecting opaque layer;
    depositing a metallic layer on said photoresist layer;
    developing an opening above said opaque defect in said patterned light-reflecting opaque layer which extends through said metallic layer and into but not completely through said photoresist layer;
    applying light into said opening to expose said photoresist layer remaining above said opaque defect;
    removing exposed photoresist to reveal said opaque defect in said patterned light-reflecting opaque layer;
    removing said opaque defect in said patterned light-reflecting opaque layer; and
    removing the remaining metallic layer and the remaining photoresist layer.

2. A method according to claim 1 wherein said step of depositing a photoresist layer on said patterned light-reflecting opaque layer includes hardening a selected thickness of said photoresist layer extending from an open surface thereof and said opening above said opaque defect extends beyond said hardened thickness of said photoresist layer.

3. A method according to claim 2 wherein said light applied into said opening to expose said photoresist layer above said opaque defect passes through this portion of the photoresist layer and is reflected by said patterned light-reflecting opaque layer for a second passage through this portion of the photoresist layer.

4. A method according to claim 3 further including the step of attaching a metallic piece to said opaque patterned light-reflecting layer to replace extra portions of said opaque layer which have been removed when said opaque defect was removed.

5. A method according to claim 4 wherein said photoresist layer has a thickness of 0.5 microns and said hardened thickness of said photoresist layer is a monolayer to 200 Å thick.

6. A method according to claim 5 wherein said metallic layer on said photoresist layer is approximately 75 Å thick.

7. A method according to claim 6 wherein said opaque defect is removed by a wet etch.

8. A method according to claim 7 wherein said metallic layer on said opaque layer and the region from which said opaque defect has been removed is 50 Å to 100 Å thick.

9. A method according to claim 6 wherein said opaque defect is removed by a dry etch.

10. A method according to claim 9 wherein said metallic layer on said opaque layer and the region from which said opaque defect has been removed is 50 Å to 100 Å thick.

11. A method for repairing defects in a photomask comprising the steps of:
    providing a photomask having:
        (a) a transparent substrate layer, and
        (b) a patterned light-reflecting opaque layer on said transparent substrate layer by which:
            (1) desired opaque and transparent regions, and
            (2) an undesired opaque defect
            are formed on said transparent substrate layer;

detecting said opaque defect in said patterned light-reflecting opaque layer;

depositing a photoresist layer on said patterned light-reflecting opaque layer;

depositing a metallic layer on said photoresist layer;

developing an opening above said opaque defect in said patterned light-reflecting opaque layer which extends through said metallic layer and into but not completely through said photoresist layer;

applying light into said opening to expose said photoresist layer remaining above said opaque defect;

removing exposed photoresist to reveal said opaque defect in said patterned light-reflecting opaque layer;

removing said opaque defect in said patterned light-reflecting opaque layer;

removing the remaining metallic layer and the remaining photoresist layer;

depositing a metallic layer over said opaque layer and the region from which said opaque defect has been removed;

repairing clear defects in said patterned light-reflecting opaque layer;

removing said metallic layer from said opaque layer and the region from which said opaque defect has been removed; and attaching a metallic piece to said opaque patterned light-reflecting layer to replace extra portions of said opaque layer which have been removed when said opaque defect was removed.

12. A method according to claim 11 wherein said step of depositing a photoresist layer on said patterned light-reflecting opaque layer includes hardening a selected thickness of said photoresist layer extending from an open surface thereof and said opening above said opaque defect extends beyond said hardened thickness of said photoresist layer.

13. A method according to claim 12 wherein said light applied into said opening to expose said photoresist layer above said opaque defect passes through this portion of the photoresist layer and is reflected by said patterned light-reflecting opaque layer for a second passage through this portion of the photoresist layer.

14. A method according to claim 13 wherein said photoresist layer has a thickness of 0.5 microns and said hardened thickness of said photoresist layer is a monolayer to 200 Å thick.

15. A method according to claim 14 wherein said metallic layer on said photoresist layer is approximately 75 Å thick.

16. A method according to claim 15 wherein said opaque defect is removed by a wet etch.

17. A method according to claim 16 wherein said metallic layer on said opaque layer and the region from which said opaque defect has been removed is 50 Å to 100 Å thick.

18. A method according to claim 15 wherein said opaque defect is removed by a dry etch.

19. A method according to claim 18 wherein said metallic layer on said opaque layer and the region from which said opaque defect has been removed is 50 Å to 100 Å thick.

20. A method for repairing an opaque defect in a photomask comprising the steps of:

providing a photomask having:
- (a) a transparent substrate layer, and
- (b) a patterned light-reflecting opaque layer on said transparent substrate layer by which:
  - (1) desired opaque and transparent regions, and
  - (2) an undesired opaque defect are formed on said transparent substrate layer;

detecting said opaque defect in said patterned light-reflecting opaque layer;

depositing a photoresist layer on said patterned light-reflecting opaque layer;

developing an opening above said opaque defect in said patterned light-reflecting opaque layer which into but not completely through said photoresist layer;

applying light into said opening to expose said photoresist layer remaining above said opaque defect;

removing exposed photoresist to reveal said opaque defect in said patterned light-reflecting opaque layer; and removing said opaque defect in said patterned light-reflecting opaque layer.

21. A method for repairing defects in a photomask comprising the steps of:

providing a photomask having:
- (a) a transparent substrate layer, and
- (b) a patterned light-reflecting opaque layer on said transparent substrate layer by which:
  - (1) desired opaque and transparent regions, and
  - (2) an undesired opaque defect are formed on said transparent substrate layer;

detecting said opaque defect in said patterned light-reflecting opaque layer;

depositing a photoresist layer on said patterned light-reflecting opaque layer;

developing an opening above said opaque defect in said patterned light-reflecting opaque layer which extends into but not completely through said photoresist layer;

applying light into said opening to expose said photoresist layer remaining above said opaque defect;

removing exposed photoresist to reveal said opaque defect in said patterned light-reflecting opaque layer;

removing said opaque defect in said patterned light-reflecting opaque layer;

removing the remaining photoresist layer;

depositing a metallic layer over said opaque layer and the region from which said opaque defect has been removed;

repairing clear defects in said patterned light-reflecting opaque layer;

removing said metallic layer from said opaque layer and the region from which said opaque defect has been removed; and attaching a metallic piece to said opaque patterned light-reflecting layer to replace extra portions of said opaque layer which have been removed when said opaque defect was removed.

* * * * *